(12) United States Patent
Eldredge et al.

(10) Patent No.: US 9,405,859 B1
(45) Date of Patent: Aug. 2, 2016

(54) USING DO NOT CARE DATA WITH FEATURE VECTORS

(71) Applicant: Micron Technology, Inc., Boise, ID (US)

(72) Inventors: Kenneth J. Eldredge, Boise, ID (US); Frankie F. Roohparvar, Monte Sereno, CA (US); Luca De Santis, Avezzano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 488 days.

(21) Appl. No.: 13/864,605

(22) Filed: Apr. 17, 2013

Related U.S. Application Data

(60) Provisional application No. 61/625,283, filed on Apr. 17, 2012.

(51) Int. Cl.
| G06F 12/00 | (2006.01) |
| G06F 13/00 | (2006.01) |
| G06F 13/28 | (2006.01) |
| G11C 11/34 | (2006.01) |
| G11C 16/04 | (2006.01) |
| G06F 17/30 | (2006.01) |
| G11C 15/00 | (2006.01) |
| G06F 12/02 | (2006.01) |

(52) U.S. Cl.
CPC .......... G06F 17/30982 (2013.01); G11C 15/00 (2013.01); *G06F 12/0246* (2013.01); *G11C 16/0483* (2013.01)

(58) Field of Classification Search
CPC ............ G06F 17/30982; G06F 3/0604; G06F 3/0638; G06F 3/0688; G06F 12/0246; G11C 15/00; G11C 16/0483
USPC .................. 711/108, 103; 704/256, 238, 241; 365/185.17
See application file for complete search history.

(56) References Cited

U.S. PATENT DOCUMENTS

| 5,422,838 | A  | * | 6/1995  | Lin ............................ 365/49.15 |
| 6,317,349 | B1 | * | 11/2001 | Wong ......................... 365/49.15 |
| 2009/0012958 | A1 | * | 1/2009  | Raj .................................... 707/6 |
| 2009/0190404 | A1 |   | 7/2009  | Roohparvar |
| 2009/0303789 | A1 | * | 12/2009 | Fernandes ................ 365/185.03 |
| 2010/0199025 | A1 | * | 8/2010  | Nanjou et al. ................. 711/103 |

* cited by examiner

*Primary Examiner* — Tuan Thai
*Assistant Examiner* — Shane Woolwine
(74) *Attorney, Agent, or Firm* — Dicke, Billig & Czaja, PLLC

(57) ABSTRACT

Methods for storing a feature vector, as well as related comparison units and systems. One such method involves programming a string of memory cells of memory to store do not care data as at least a portion of a value of an attribute of the feature vector.

23 Claims, 12 Drawing Sheets

| INPUT (D) | MEMORY DATA (a) | OUTPUT |
|---|---|---|
| 0 | 10 X F | 0110 |
| 1 | 10 X F | 1010 |
| X | 10 X F | 1110 |
| F | 10 X F | 0000 |

INPUT (D)          MEMORY $D\ \bar{D}$          $a\ \bar{a}$

0 = L H          0 = L H

1 = H L          1 = H L

X = L L          X = H H

F = H H          F = L L

STATE DEFINITIONS

FIG. 5

USING DO NOT CARE DATA WITH FEATURE VECTORS

RELATED APPLICATION

This application is a non-provisional of provisional U.S. application Ser. No. 61/625,283, filed Apr. 17, 2012, titled "USING DO NOT CARE DATA WITH FEATURE VECTORS," which is related to provisional U.S. application Ser. No. 61/476,574, filed Apr. 18, 2011, titled "METHODS AND APPARATUS FOR PATTERN MATCHING" commonly assigned.

TECHNICAL FIELD

The present embodiments relate generally to memory and a particular embodiment relates to using do not care data with feature vectors.

BACKGROUND

Memory is typically provided as an integrated circuit(s) formed in and/or on semiconductor die(s), whether alone or in combination with another integrated circuit(s), and is commonly found in computers or other electronic devices. There are many different types of memory including random-access memory (RAM), read only memory (ROM), dynamic random access memory (DRAM), synchronous dynamic random access memory (SDRAM), and flash memory.

Flash memories have developed into a popular source of non-volatile memory for a wide range of electronic applications. Flash memories typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line (e.g., by a select gate).

Content addressable memories (CAM) are memories that implement a lookup table function. They use dedicated comparison circuitry to perform the lookups. CAMs are often used in network routers for packet forwarding and the like. Each individual memory cell in a traditional CAM requires its own comparison circuit in order to allow the CAM to detect a match between a bit of data of a received (e.g., "unknown") feature vector and a bit of data of a feature vector (e.g., a known feature vector) stored in the CAM. Typical CAM cells use approximately nine to ten transistors for a static random access memory (SRAM)-based CAM, or four to five transistors for a dynamic random access memory (DRAM)-based CAM.

CAMs store input feature vectors for later comparison (e.g., as part of searching). An input feature vector can include a plurality of attributes (e.g., terms, features, etc.), such as those that define an object. For example, an input feature vector for a person might include attributes such as hair color, height, weight, and other features that can be used to uniquely identify a particular person.

FIG. 1 illustrates a typical prior art classification system for an input feature vector 100. The system can have multiple known groups of data feature vectors 101, 102, 103 stored in memory. These data feature vectors are shown in FIG. 1 in terms of an x-y coordinate system in order to illustrate a typical prior art method for determining the data feature vector (e.g., a single feature vector or a group of feature vectors 101-103) of the data feature vectors to which the input feature vector is closest.

An initial search of the CAM using the input feature vector 100 might not turn up an exact match to a data feature vector already stored in the CAM. It might be desirable to then find the data feature vector(s) to which the input feature vector is closest. This can be accomplished by determining a shortest x and/or y distance between the input feature vector and the data feature vector(s). However, such a distance comparison method can be a time consuming process since a large number of data feature vectors can require a large number of distance comparisons.

For the reasons stated above and for other reasons that will become apparent to those skilled in the art upon reading and understanding the present specification, there is a need in the art for a more streamlined approach for comparison of a received (e.g., input) feature vectors to stored (e.g., data) feature vectors.

BRIEF DESCRIPTION OF THE DRAWINGS

FIG. 5 shows a logical truth table in accordance with the embodiment of FIG. 4.

DETAILED DESCRIPTION

Figure 1:
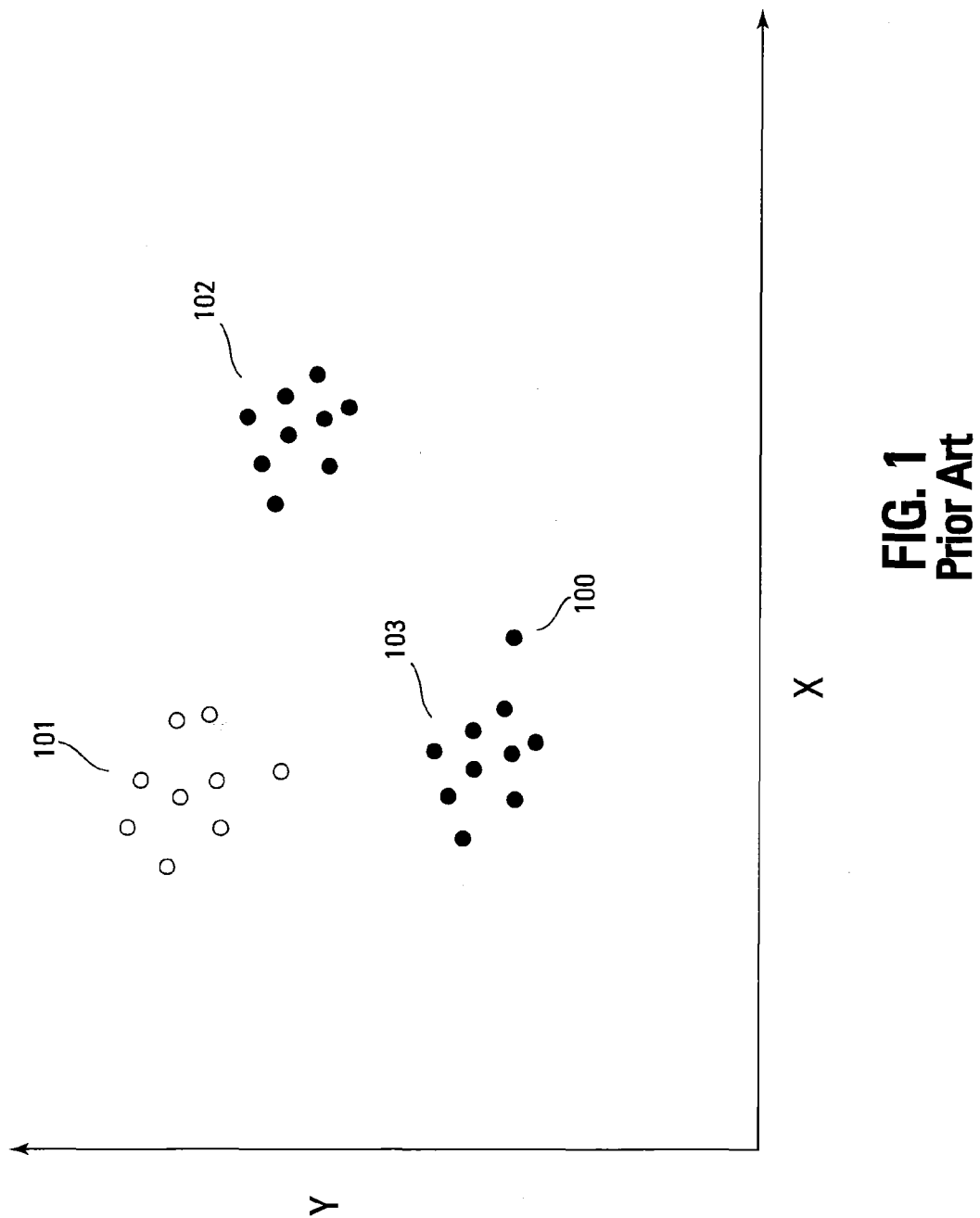
FIG. 1 shows a diagram of a typical prior art classification system of an input feature vector.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

One or more of the subsequently described embodiments include using do not care data (e.g., do not care bits, do not cares, "X") with feature vectors (with either input or data feature vectors), such as to define boundary areas in memory. As is well known in the art, do not care data ("X") can be inserted into a digit of data (e.g., replacing the actual value of the digit) such that the actual value of such a digit of data no longer affects the matching of the data as a whole. For example, data 1X can be used to match both binary 10 and binary 11. The do not care data ("X") can be used with input (e.g., unknown) feature vectors and/or data (e.g., known) feature vectors.

A feature vector can be represented by $F(A)=A_1, A_2, A_3, A_4, \ldots A_n$ where "A" can be an attribute that defines a particular object. In the case of a data feature vector F(A), the value of each attribute "A" can be stored as a number of digits of data by programming at least a portion of a string(s) of memory cells (where a "number of digits" some can be one or more digits). For example, the value of attribute $A_1$ can be stored as binary 1101 (decimal 13) by programming, for example, eight (8) single-level memory cells of a string (e.g., with each digit of data being stored by programming a respective pair of the single-level cells of the string).

Figure 2:
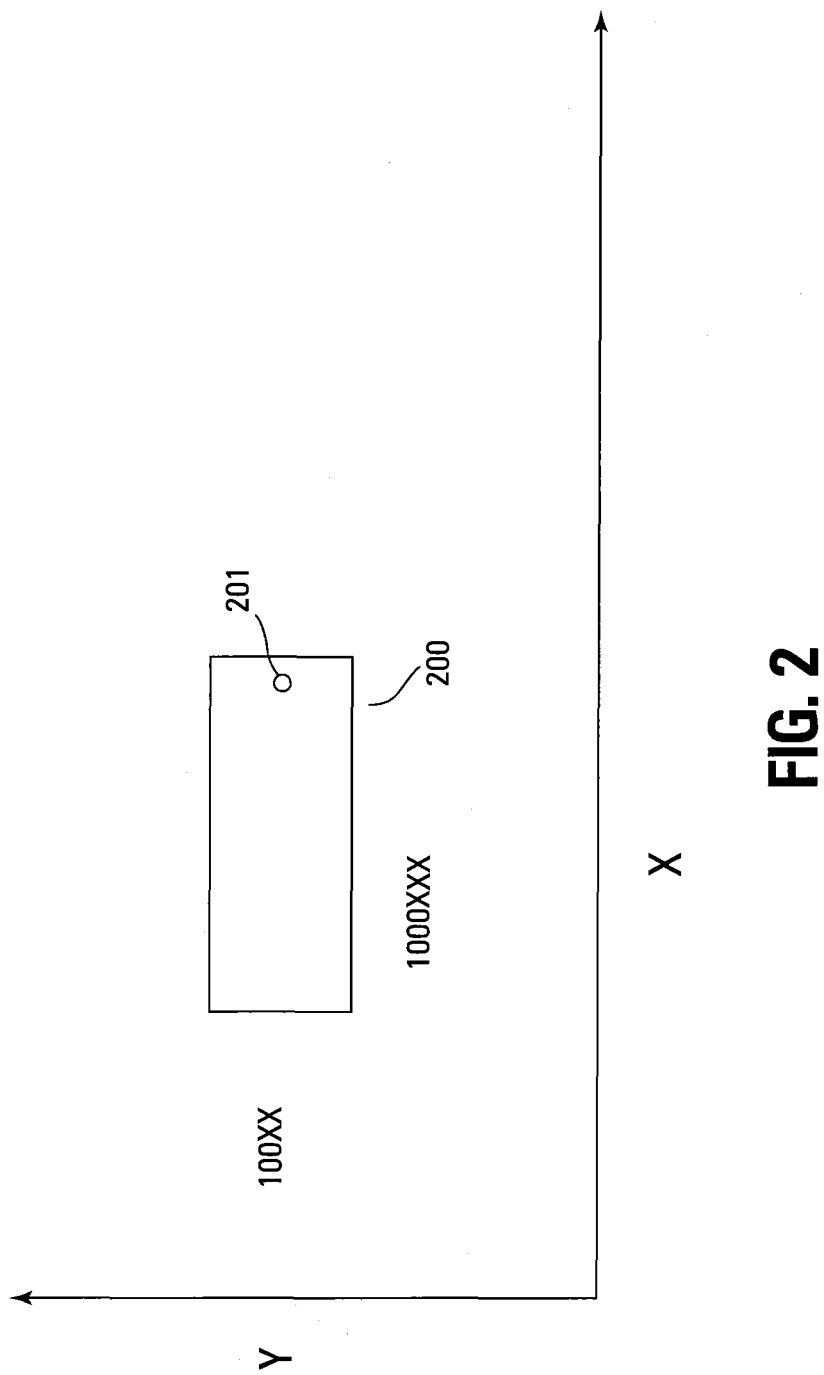
FIG. 2 shows a diagram of one embodiment of a classification system of using do not care data with a feature vector to define boundaries of an area.

FIG. 2 illustrates a x-y coordinate classification system, similar to the classification system illustrated in FIG. 1, but the embodiment of FIG. 2 has expanded a feature vector using do not care data. For example, if the expanded feature vector is F(x,y)=1000XX, 100XX, it can be represented by the area 200 of FIG. 2.

If a feature vector 201 is compared to the expanded feature vector F(x,y), it can be seen that the feature vector 201 is included in the area 200 of the expanded feature vector. Thus, if one attribute of a feature vector is a person's weight, the feature vector can be expanded by area 200 (using do not care data X) to encompass a range of different weights. In an embodiment, the feature vector 201 can be an input feature vector and the expanded feature vector F(x,y) can be a data feature vector stored in memory. In an alternate embodiment, the expanded feature vector F(x,y) can be an input feature vector and the feature vector 201 can be a data feature vector stored in memory. In yet another embodiment, both the input feature vector and the data feature vector can include do not care data.

Figure 3:
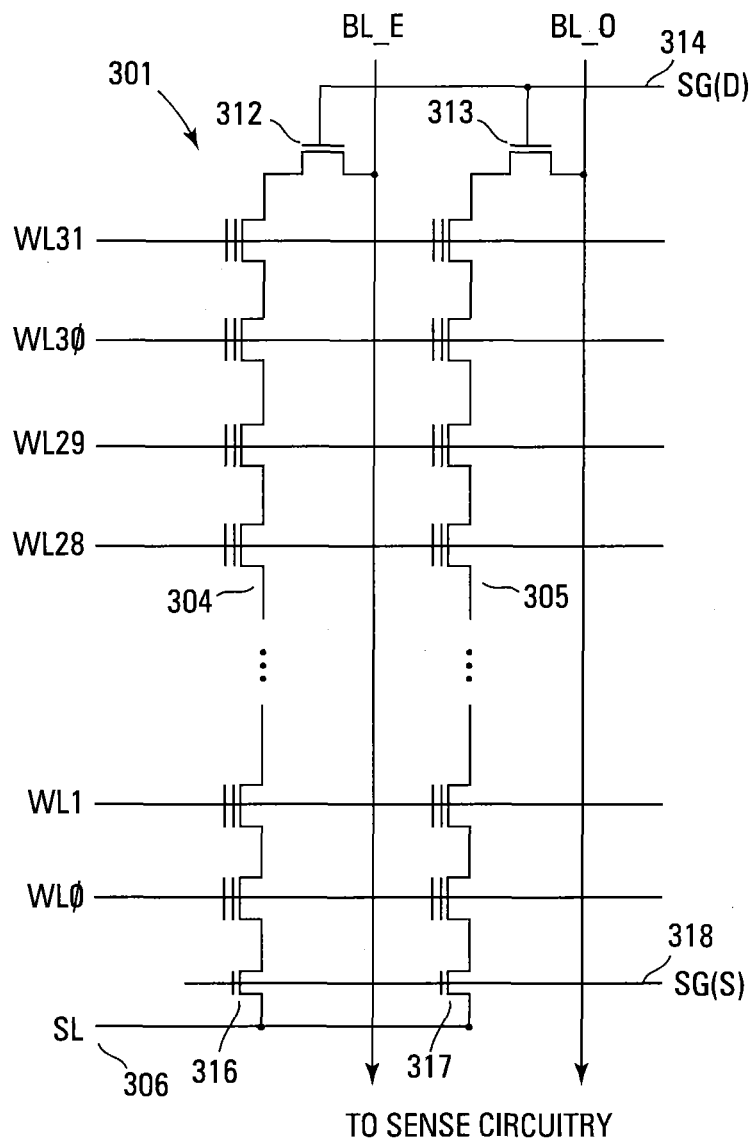
FIG. 3 shows a schematic diagram of one embodiment of a portion of a memory array.

FIG. 3 illustrates a schematic diagram of one embodiment of a portion of a NAND architecture memory array 301 comprising series strings of non-volatile memory cells. The present embodiments of the memory array are not limited to the illustrated NAND Flash architecture. Alternate embodiments might include AND and NOR flash memory as well as PCM, RRAM, and MRAM technologies.

The memory array 301 comprises an array of non-volatile memory cells (e.g., floating gate or charge trap-based memory cells) arranged in columns such as series strings 304, 305. Each of the cells is coupled drain to source in each series string 304, 305. An access line (e.g., word line) WL0-WL31 that spans across multiple series strings 304, 305 is coupled to the control gates of each memory cell in a row in order to bias the control gates of the memory cells in the row. Data lines, such as even/odd bit lines BL_E, BL_O, are coupled to the series strings and eventually coupled to sense circuitry (e.g., sense amplifier) that detects the state of each cell by sensing current or voltage on a selected bit line.

Each series string 304, 305 of memory cells is coupled to a source line 306 by a source select gate 316, 317 (e.g., transistor) and to an individual bit line BL_E, BL_O by a drain select gate 312, 313 (e.g., transistor). The source select gates 316, 317 are controlled by a source select gate control line SG(S) 318 coupled to their control gates. The drain select gates 312, 313 are controlled by a drain select gate control line SG(D) 314.

In a typical prior art programming of the memory array, each memory cell is individually programmed as either a single level cell (SLC) or a multiple level cell (MLC). The prior art uses a cell's threshold voltage ($V_t$) to store data in the cell. For example, programming an SLC to a $V_t$ of 2.5V might store a binary 0, while programming that SLC to a $V_t$ of −0.5V might store a binary 1. An MLC uses multiple $V_t$ ranges that each indicates a different data state. Multiple level cells can take advantage of the analog nature of a traditional flash cell by assigning a particular bit pattern to a specific $V_t$ range.

Figure 4:
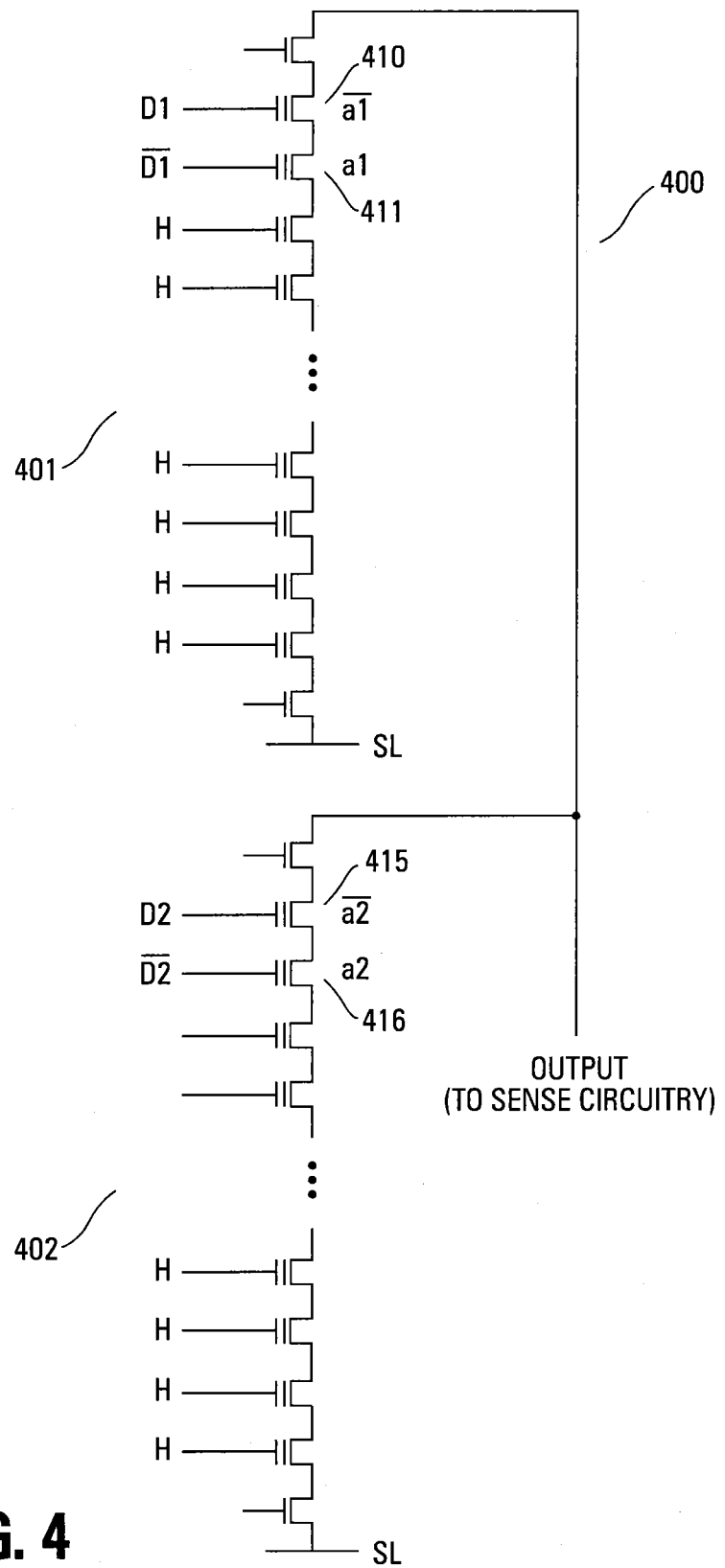
FIG. 4 shows a schematic diagram of one embodiment of NAND memory that uses do not care data with feature vectors.

FIG. 4 illustrates one embodiment of a NAND memory cell architecture that uses do not care data with feature vectors, such as previously described. The circuit comprises two series strings of memory cells 401, 402 that can have the architecture of the memory array of FIG. 3. The drain side of each series string 401, 402 is coupled to the same bit line 400 that is coupled in turn to sense circuitry (not shown). The source side of both series strings 401, 402 is coupled to a source line SL. The bit line 400 acts as a summing node for the outputs from each series string 401, 402.

The "H" signal can be a pass signal. In an embodiment, the pass signal H has a voltage level high enough (e.g., about 4V in a particular embodiment) to operate a memory cell having its control gate coupled thereto as a pass-transistor, regardless of the programmed $V_t$ of the cell. According to an embodiment, control gates of unselected cells of a string of memory cells (e.g., those cells corresponding to the at least a portion of a value of an attribute not then being compared) might thus be biased with the pass signal (H) to operate them as pass-transistors.

The D and $\overline{D}$ signals represent complimentary voltage signals. For example, control gates of memory cells 410 and 411 might be biased with a voltage level D1 of about 2V and a voltage level $\overline{D1}$ of about 4 V, respectively, if a corresponding digit of data of a received feature vector has a value of binary 0. Meanwhile, the control gates of memory cells 410 and 411 might be biased with a voltage level D1 of about 4V and a voltage level $\overline{D1}$ of about 2 V, respectively, if the corresponding digit of data of the received feature vector has a value of binary 1. The $\overline{a1}$ and a1 values represent the threshold voltages to which memory cells 410 and 411, respectively, are programmed to store at least a portion of a value of an attribute of the feature vector stored in the first series string of memory cells 401. For example, memory cells 410 and 411 might be programmed to threshold voltages of about 3V (a1) and about 1V, respectively, to store a value of binary 0 for a digit of data of the stored data feature vector. Meanwhile, memory cells 410 and 411 might be programmed to threshold voltages of about 1V and about 3V, respectively, to store a value of binary 1 for the digit of data of the data feature vector. Similarly, the $\overline{a2}$ and a2 values represent the threshold voltages to which memory cells 415 and 416, respectively, are programmed to store at least a portion of a value of an attribute of the data feature vector stored in the second series string of memory cells 402.

The logic truth table of FIG. 5 illustrates the results from comparing a digit of data "D" of an attribute of an input feature vector (referred to hereinafter as digit D) to a corresponding digit of data "a" of the same attribute of the stored feature vector (referred to hereinafter as digit a). With additional reference to FIG. 4, for example, during a compare operation of an input feature vector to a stored feature vector, for a digit a, the control gates of the memory cells 410 and 411 can be biased with the D and $\overline{D}$ signals, where the voltage levels of those signals are selected in accordance with the value of digit D. If the voltage level of the respective D/$\overline{D}$30 signal is greater than the programmed threshold voltage (e.g., $\overline{a1}$ or a1) of the respective memory cell (e.g., 410 or 411), the respective memory cell will conduct. If the voltage level of the respective D/$\overline{D}$ signal is less than the programmed threshold voltage (e.g., $\overline{a1}$ or a1) of the respective memory cell (e.g., 410 or 411), the respective memory cell will not conduct. According to an embodiment implementing the truth table of FIG. 5, if the value of digit D matches the value of digit a, at least one of the memory cells (e.g., 410 or 411) will not conduct in response to being biased with the D and $\overline{D}$ signals selected in accordance with the value of digit D.

Referring to FIG. 5, the first column includes three possible values (binary 0, binary 1, and X) for digit D. For a particular digit D, for example, control gates of a corresponding pair of memory cells can be biased with D and $\overline{D}$ signals having voltage levels selected in accordance with the value of that digit D. For example, if the digit D has a value of binary 0, the control gate of a first memory cell (e.g., memory cell 410) of the pair might be biased with a signal D having a voltage level of about 2V and the control gate of a second memory cell of the pair (e.g., memory cell 411) might be biased with a signal $\overline{D}$ having a voltage level of about 4V. Continuing with such an example, if the digit D has a value of binary 1, the control gate of a first memory cell (e.g., memory cell 410) of the pair might be biased with a signal D having a voltage level of about 4V and the control gate of a second memory cell of the pair (e.g., memory cell 411) might be biased with a signal $\overline{D}$ having a voltage level of about 2V. Further continuing with the example, if do not care data "X" has been inserted into the digit D, the control gate of the first memory cell (e.g., memory cell 410) of the pair might be biased with a signal D having a voltage level of about 0V and a second memory cell of the pair (e.g., memory cell 411) might be biased with a signal $\overline{D}$ also having a voltage level of about 0V (thus ensuring neither cell of the pair conducts, assuring a match no matter what actual data is stored by the pair of cells).

The "F" entry in the first column of FIG. 5 corresponds to an operation of corresponding memory cells in a pass through mode, such as where their control gates are both biased with the pass through signal H instead of signal D or $\overline{D}$ (e.g., allowing other digits to be compared).

Each row of the second column of FIG. 5 illustrates four possible values for digit a (i.e., the digit of data being compared to the digit D). For a particular digit a, for example, a pair of memory cells can be programmed to threshold voltages (e.g., $\overline{a1}$, a1) selected in accordance with the value of digit a. For example, if the digit a has a value of binary 0, a first memory cell (e.g., memory cell 410) of the pair might be programmed to a threshold voltage (e.g., $\overline{a1}$) of about 3V while the second memory cell of the pair (e.g., memory cell 411) might have a threshold voltage (e.g., a1) of about 1V. Continuing with such an example, if the digit a has a value of binary 1, the second memory cell (e.g., memory cell 411) of the pair might be programmed to a threshold voltage ($\overline{a1}$) of about 3V and the first memory cell of the pair (e.g., memory cell 410) might have a threshold voltage of about 1V. Further continuing with the example, to store do not care data "X" for digit a, a first memory cell (e.g., memory cell 410) of the pair might be programmed to a threshold voltage (e.g., a1) of about 3V and the second memory cell of the pair (e.g., memory cell 411) might also be programmed to a threshold voltage (e.g., a1) of about 3V (thus ensuring that at least one cell of the pair does not conduct regardless of the selected voltage level of D/$\overline{D}$, thereby assuring a match regardless of the value of digit D).

Each row of the third column of FIG. 5 illustrates a respective result of comparing the value of digit D to each of the four possible values for digit a. A binary 1 indicates no current conduction on the bit line coupled to the string. A binary 0 indicates that current is flowing. Thus, referring to the first row of the third column of FIG. 5, when digit D has a value of binary 0 and the corresponding pair of memory cells store a binary 1, the result is binary 0—indicating a no match condition. When the digit D has a value of binary 0 and the corresponding pair of memory cells store a binary 0, the result is binary 1—indicating a match condition. When the digit "D" has a value of binary 0 and the corresponding pair of memory cells store do not care data (X), the result is binary 1—indicating a match condition. When the digit "D" has a value of binary 0 and the pair of memory cells are programmed low, the result is 0—indicating a no match condition.

FIG. 5 also includes examples of state definitions from the logic truth table. The input (D, $\overline{D}$) has the illustrated logic highs (H) and logic lows (L) as indicated. The memory (a, $\overline{a}$) has the illustrated logic highs (H) and logic lows (L) as indicated.

Figure 6:
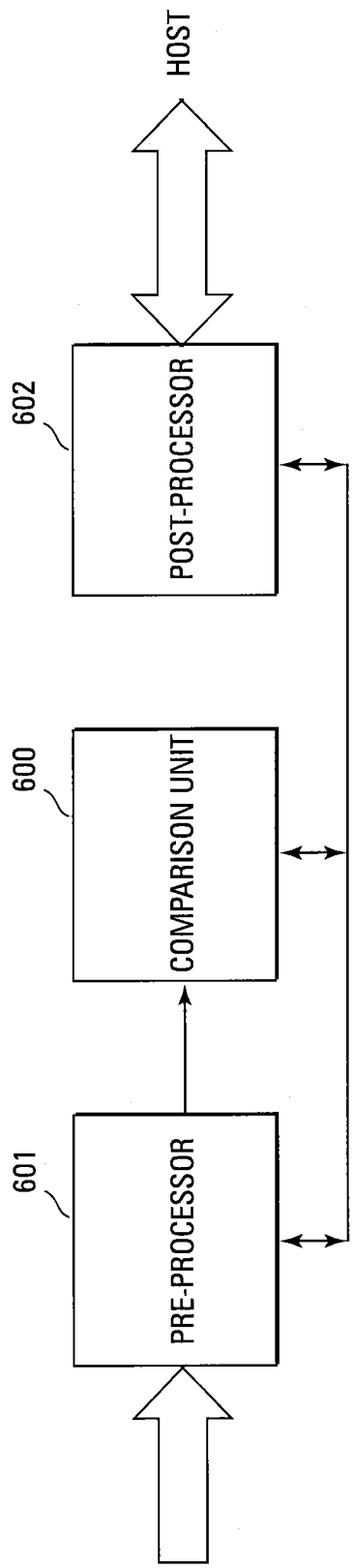
FIG. 6 shows a block diagram of one embodiment of a system that can incorporate memory using do not care data with feature vectors.

FIG. 6 shows a block diagram of one embodiment of a system that can incorporate the memory array of FIG. 3 as the comparison unit 600 that provides the comparison of input feature vectors to data feature vectors. In one embodiment, such a system could use NAND memory as the comparison unit 600 to store data feature vectors for later comparison.

For example, the system could be used in a security system. The known values of a number of attributes of a person of interest could be stored in memory 600 as a data feature vector. When a camera detects a person, detected values of those attributes of that person can then be compared with the values of those attributes stored for the person of interest. In other words, the detected person would provide the values of the attributes of the input feature vector to be compared to the values of the attributes of the data feature vector. The system user could have inserted do not care data into the system for attributes that are less important than others so that an exact match is not required by the system in order to flag an unknown person as being a possible suspect.

For example, if do not care data is inserted for the hair color attribute of the known feature vector, this attribute will be effectively ignored during the comparison of the input feature vector to the data feature vector. In this way, only the attributes of a person that are difficult to change/hide might be compared. The do not care data can be inserted as previously described, for example.

The system comprises a pre-processor 601 that generates a data feature vector to be stored in memory 600. In one embodiment, the data feature vector is generated by a user of the system using the pre-processor. During the process of generating the data feature vector, do not care data can be inserted into, for example, a digit(s) of an attribute of the data feature vector that will not matter during a comparison operation, thus expanding the data feature vector. The pre-processor 601 can transmit the expanded known feature vector to the comparison unit 600.

The expanded feature vector can be stored in the comparison unit 600. The comparison unit 600 is configured to compare an input feature vector to the data feature vector. The comparison can be accomplished as discussed previously. In one embodiment, the comparison unit 600 can represent a plurality of comparison units (e.g., memories) to provide larger data bases. Thus, comparisons can be performed by multiple comparison units in parallel.

A post-processor 602 can be coupled to either or both the comparison unit 600 and the pre-processor 601. The post-processor can provide the system intelligence (e.g., controller), such as to manage the flow of data and the interfaces between the units 600-602, and to manage error correction (e.g., ECC generation). The post-processor 602 can also control the comparison of the input (e.g., unknown) feature vector to the stored (e.g. known) data feature vector by controlling the bias operations. In one embodiment, the post-processor 602 can be a NAND memory controller (e.g., on-die control circuitry) that is part of NAND memory.

FIGS. 7-10 illustrate additional embodiments of x-y plots of complex patterns possible from using do not care data to expand feature vectors. While the embodiments of FIGS. 2 and 7-10 illustrate two dimensional feature vectors expanded by do not care data to form areas, alternate embodiments can include N-dimensional feature vectors as well. In the embodiments of FIGS. 7-10, the logical combining can be accomplished in a page buffer(s) of the memory.

These stored data feature vectors, expanded with do not care data, can be used as templates (e.g., memory boundaries) in memory. The templates can be considered stored patterns in memory that are compared to a received feature vector. If the received vector matches the stored template, then a match has occurred.

Figure 7:
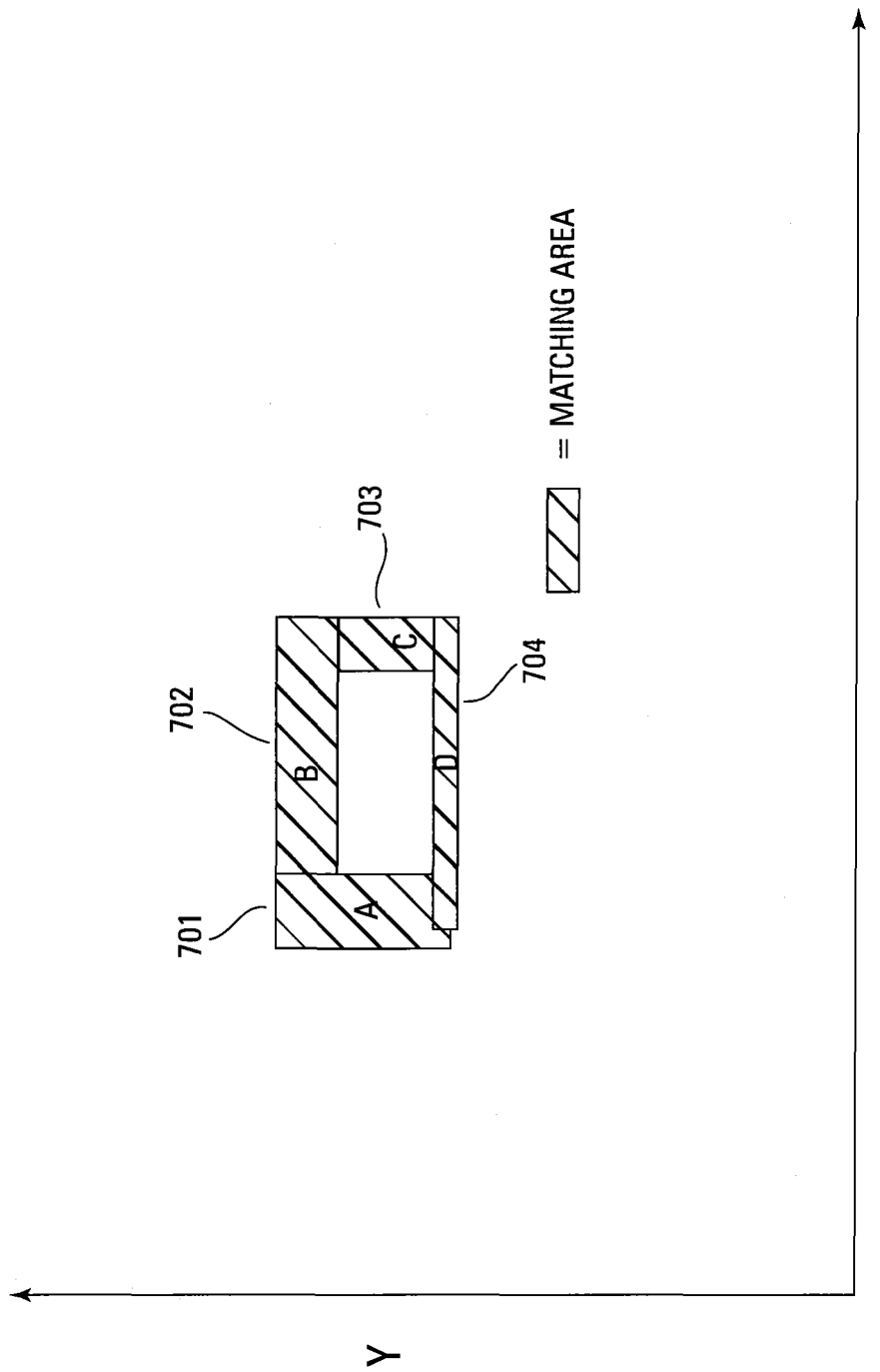
FIG. 7 shows one embodiment of a combination of multiple feature vectors.

FIG. 7 illustrates an embodiment that results from a logical OR combination of four feature vectors F(A), F(B), F(C), and F(D). This pattern could be accomplished by inserting do not care data into the F(A), F(B), F(C), and F(D) vectors, and programming respective series strings of memory cells that are coupled to a common bit line to store the expanded feature vectors (thus logically ORing the expanded feature vectors to generate the combined area of feature vectors 701-704 shown). An input feature vector being compared to the logically combined expanded feature vectors would generate a match if it was located in any of the F(A), F(B), F(C), or F(D) feature vector areas 701-704.

Figure 8:
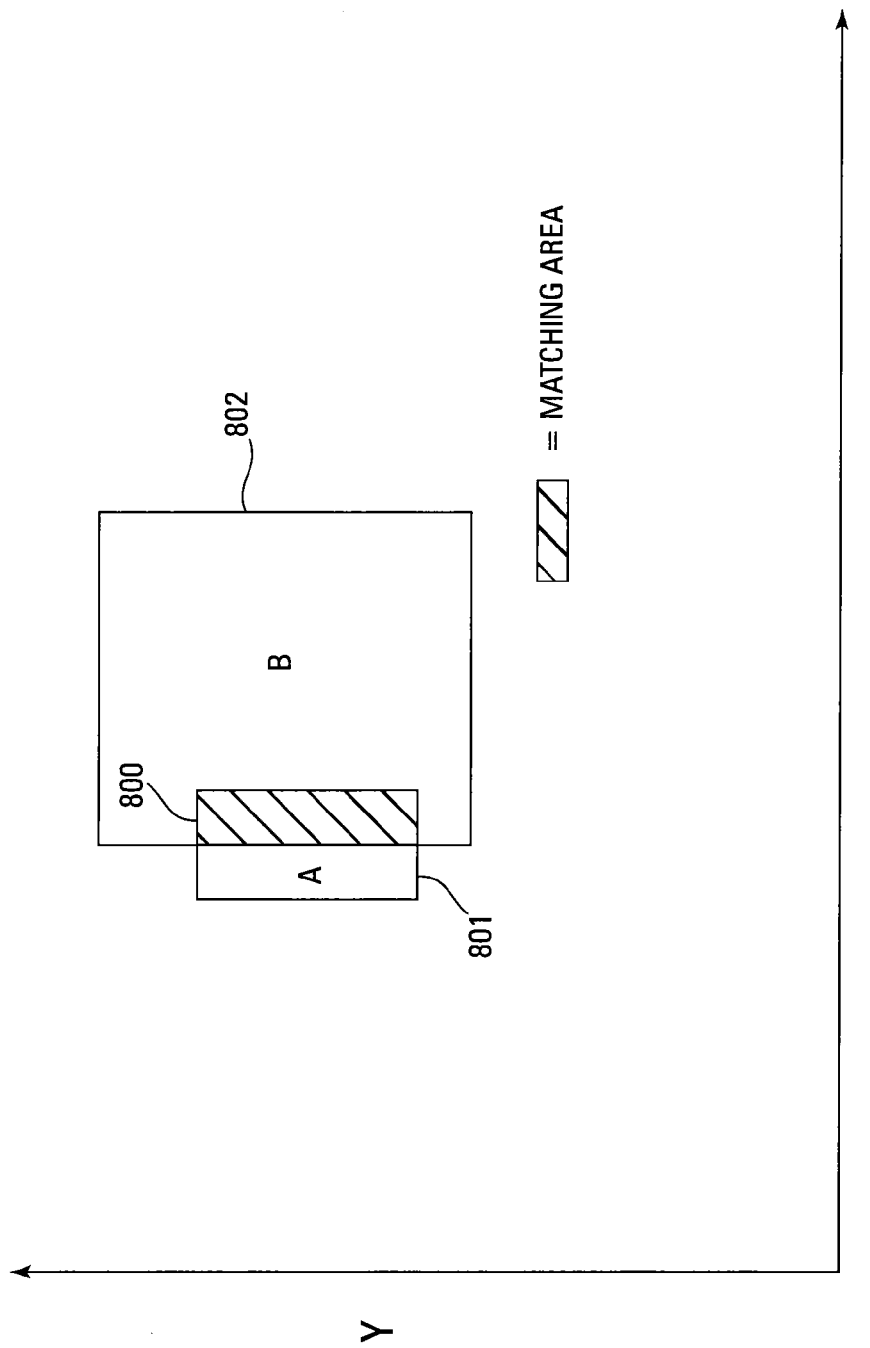
FIG. 8 shows another embodiment of a combination of multiple feature vectors.

FIG. 8 illustrates an embodiment that results from a logical AND combination of two feature vectors F(A) and F(B). This pattern could be accomplished by inserting do not care data into the F(A) and F(B) vectors, and programming a single series string of memory cells to store the expanded feature vectors (thus logically ANDing the expanded feature vectors). An input feature vector being compared to the logically combined expanded feature vectors would generate a match if it was located in the intersecting area 800 of the F(A) and F(B) feature vector areas 801, 802.

Figure 9:
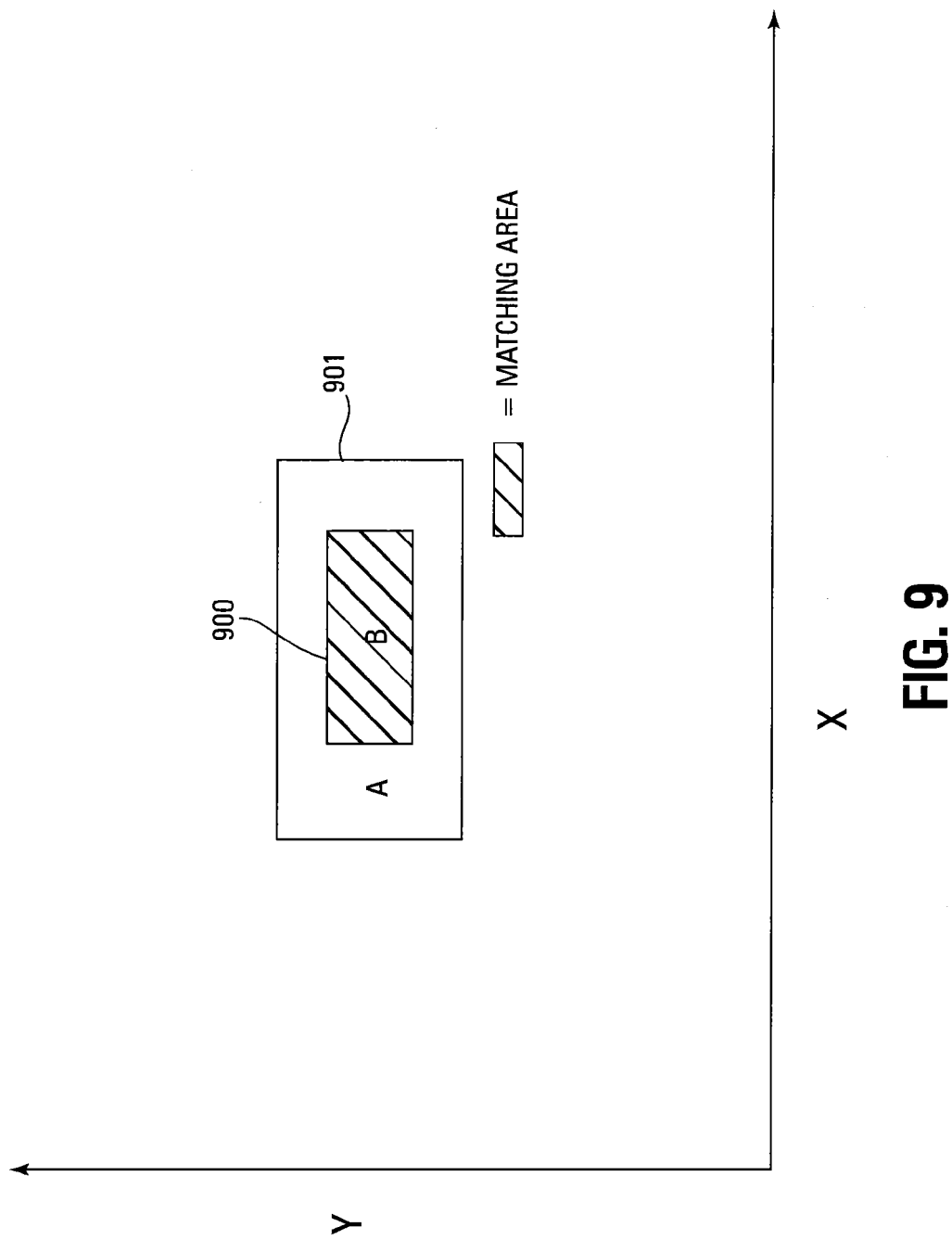
FIG. 9 shows another embodiment of a combination of multiple feature vectors.

FIG. 9 illustrates another embodiment that results from a logical AND combination of two feature vectors F(A) and F($\overline{B}$). This pattern could be accomplished by inserting do not care data into the F(A) and F($\overline{B}$) vectors, and programming the same series string of memory cells to store the expanded feature vectors (thus logically ANDing the expanded feature vectors). An input feature vector being compared to the logically combined expanded feature vectors would generate a match if it was located in the intersecting area 900 of the F(A) and F($\overline{B}$) feature vector areas 901, 900.

Figure 14:
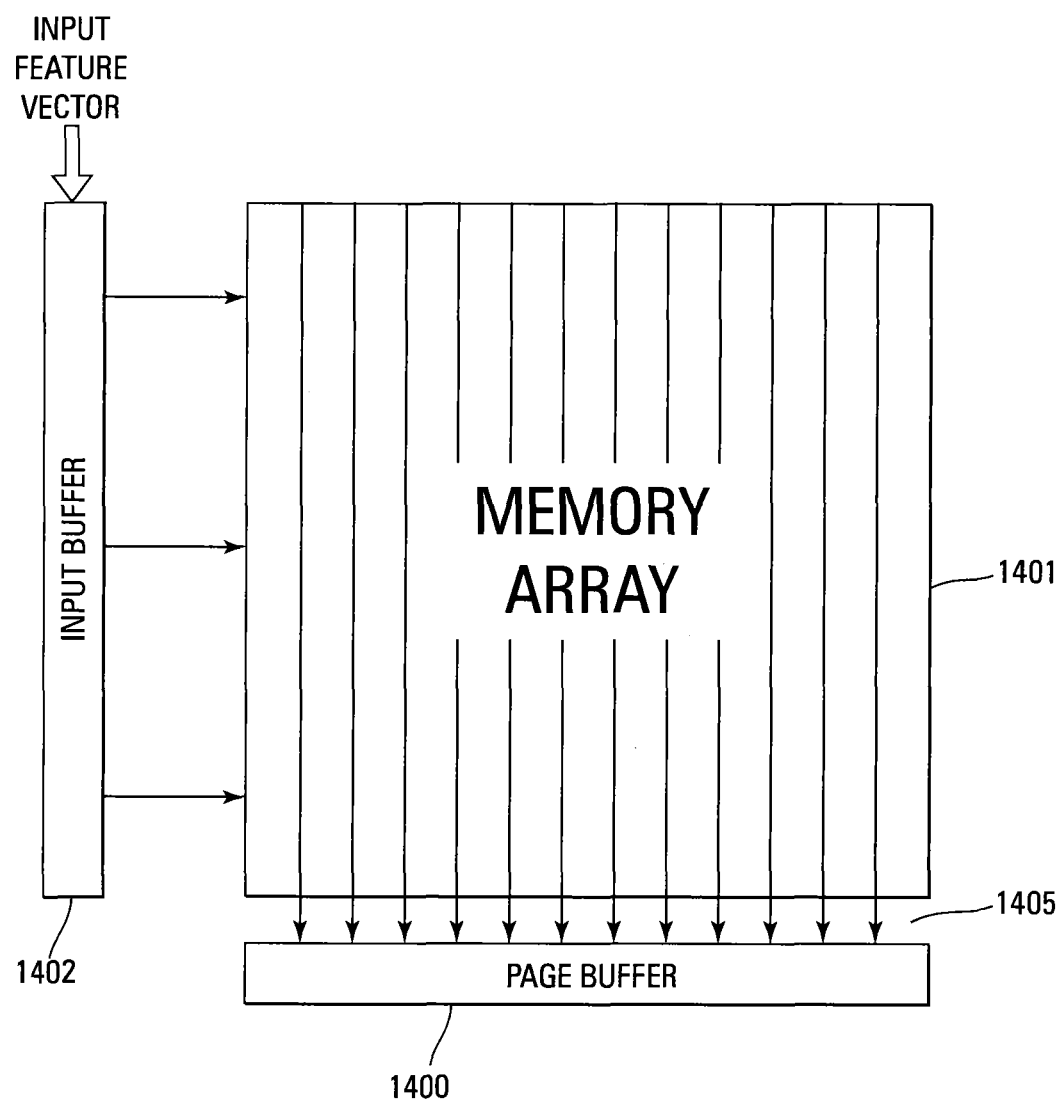
FIG. 14 shows a block diagram of one embodiment of a memory device.

The logical AND combinations of FIGS. 8 and 9, as well as the other logical combinations presently disclosed, can be performed in the page buffer, as illustrated in FIG. 14. FIG. 14 shows the page buffer 1400 coupled to the bit lines 1405 of the memory array 1401. An input buffer 1402 is also coupled to the memory array. The input buffer 1402 can be used to temporarily store input feature vectors for comparison to the data feature vectors stored in the memory array 1401. The memory array 1401 can comprise a plurality of series strings of memory cells as illustrated in FIG. 3. Data columns in this memory array 1401 can be referred to as the data feature vectors.

The page buffer 1400 is configured to perform the logical comparisons (e.g., AND, NAND, OR, XOR) as presently described. The page buffer 1400 is also configured to perform summations, create addresses, as well as other logical operations.

Figure 10:
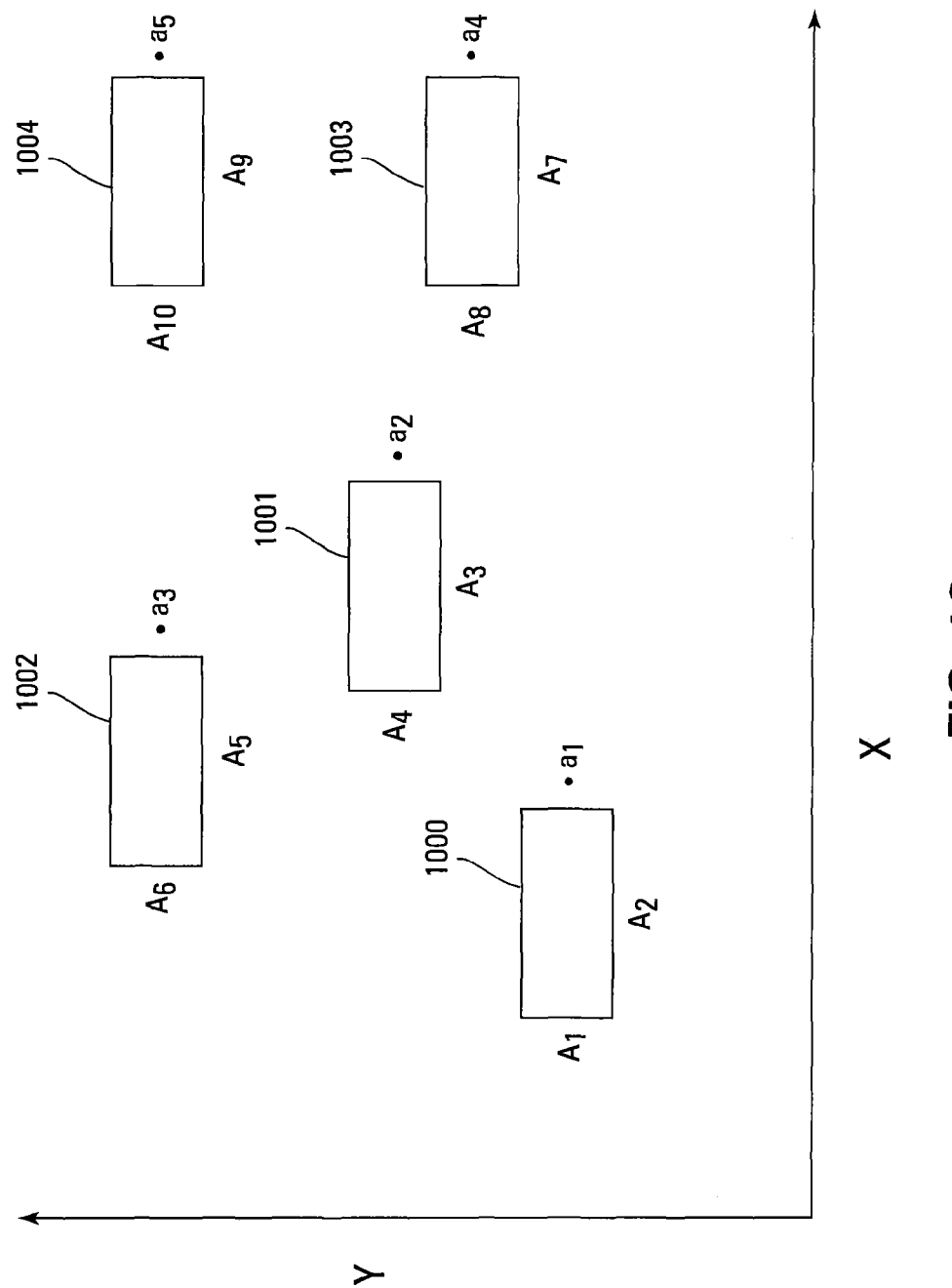
FIG. 10 shows an alternate embodiment of a complex pattern area that results from using do not care data with either a data feature vector or an input feature vector.

FIG. 10 illustrates an embodiment that shows a single feature vector F(A) of a single bit line that has a plurality of attributes (e.g., F(A)=$A_1, A_2, A_3, A_4, A_5, A_6, A_7, A_8, A_9$ that have each been expanded to areas 1000-1004 by inserting do not care data into each attribute A. FIG. 10 also illustrates attributes $a_1, a_2, a_3, a_4$, and $a_5$ that have not been expanded to areas and are each logically ANDed to their respective area attribute 1000-1004.

An example application of such an embodiment would be a human finger print where the attributes $a_x$ represent the minutiae (e.g., ridges, islands) and the $A_x$ attributes represent the location of the minutiae on the finger print. In the embodiment of FIG. 10, in order for the input feature vector to match the stored, known data feature vector, it must contain an exact match for all of the attributes $a_x$ and must also be within the defined areas of the $A_x$ attributes.

Figure 11:
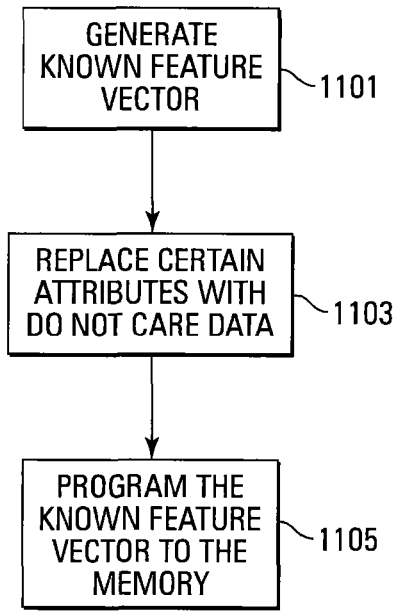
FIG. 11 shows a flowchart of one embodiment of a method for storing a data feature vector in memory.

FIG. 11 illustrates a flowchart of one embodiment of a method for storing a feature vector in memory. The feature vector is generated from a plurality of attributes 1101. Do not care data is inserted into (e.g., replacing and/or combination with actual data) particular ones of the attributes 1103 to expand the feature vector. The expanded feature vector is then stored in memory 1105.

Figure 12:
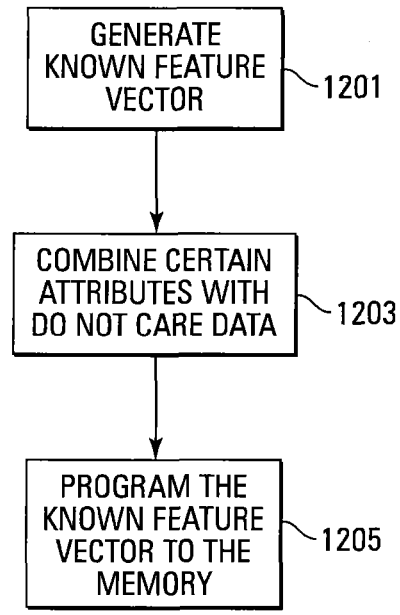
FIG. 12 shows a flowchart of an alternate embodiment of a method for storing a data feature vector in memory.

FIG. 12 illustrates a flowchart of an alternate embodiment of a method for programming a data feature vector to a memory device. The data feature vector is generated from a plurality of attributes 1201. Instead of replacing the known attributes with do not care data, this embodiment combines known attributes with do not care data 1203. The input feature vector with the do not care data is then programmed to the memory device 1205.

Figure 13:
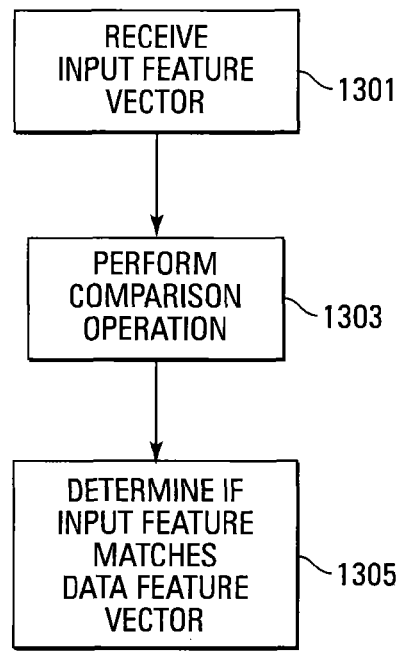
FIG. 13 shows a flowchart of one embodiment of a method for comparing an input feature vector to a data feature vector.

FIG. 13 illustrates a flowchart of one embodiment of a method for comparing an input feature vector to a data feature vector. The memory receives the input feature vector 1301. A comparison is then performed 1303. In one embodiment, this is accomplished by selecting voltage levels to bias corresponding memory cells in accordance with at least a portion of the value of an attribute of the feature vectors being compared. It can then be determined if the input feature vector matches the data feature vector 1305 responsive to determining whether a current/voltage is detected on a bit line(s) (e.g., the bit line coupled to a series string of memory cells including the memory cells being biased).

CONCLUSION

In summary, one or more embodiments include using do not care data to expand a feature vector(s) to an area or a plurality of areas. Each attribute of the feature vector can be expanded by inserting do not care data into each attribute. The feature vector can be either/both a stored (e.g., known) data feature vector or/and a received (e.g., unknown) input feature vector to be compared to the stored feature vector.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for storing feature vectors in a memory, the method comprising:
    generating a first feature vector having a plurality of attributes with each attribute of its plurality of attributes having a respective value;
    generating a second feature vector having a plurality of attributes with each attribute of its plurality of attributes having a respective value;
    programming a string of memory cells of the memory to store at least one attribute of the first feature vector and to store at least one attribute of the second feature vector;
    programming the string of memory cells of the memory to store do not care data as at least a portion of the respective value of an attribute of the first feature vector;
    wherein each memory cell of the string of memory cells has a control gate coupled to a different access line; and
    wherein programming the string of memory cells to store do not care data for a digit of the attribute of the first feature vector comprises programming a pair of memory cells of the string of memory cells to threshold voltages such that at least one memory cell of the pair of memory cells will not conduct in response to applying respective voltages to the control gates of the pair of memory cells through their respective access lines during a reading of the digit of the attribute of the first feature vector by the memory.

2. The method of claim 1 wherein programming a string of memory cells of the memory comprises programming a series string of memory cells of the memory.

3. The method of claim 2 wherein each of a number of series strings of memory cells of the memory is programmed to store the respective value of a different attribute of the first feature vector.

4. The method of claim 2 wherein programming a series string of memory cells of the memory comprises programming a NAND string of memory cells.

5. The method of claim 1 wherein programming the pair of memory cells of the string to store the do not care data for the digit of the attribute comprises programming each of the memory cells of the pair of memory cells to substantially the same threshold voltage.

6. The method of claim 1, wherein programming the string of memory cells of the memory further comprises programming another pair of memory cells of the string to store actual data for another digit of the attribute of the first feature vector.

7. The method of claim 1, wherein generating the first feature vector comprises expanding a known feature vector by inserting the do not care data into the known feature vector.

8. The method of claim 1 wherein programming the string of memory cells of the memory further comprises programming another pair of memory cells of the string to store at least a portion of the respective value of another attribute of the first feature vector.

9. The method of claim 1, wherein the string of memory cells is coupled to a particular data line, and further comprising programming another string of memory cells coupled to the particular data line to store do not care data as at least a portion of a value of an attribute of a third feature vector, wherein a fourth feature vector being compared to the first feature vector and the third feature vector would generate a match if the fourth feature vector was located in a combined area of the first feature vector and the third feature vector.

10. The method of claim 1, further comprising programming the string to store do not care data as at least a portion of the respective value of an attribute of the second feature vector, wherein a third feature vector being compared to the first feature vector and the second feature vector would generate a match only if the third feature vector was located in an intersecting area of the first feature vector and the second feature vector.

11. The method of claim 1, wherein the attribute of the first feature vector comprises an expanded attribute, and further comprising programming the string of memory cells of the memory to store actual data as at least a portion of the respective value of a non-expanded attribute of the first feature vector, wherein a third feature vector being compared to the first feature vector would generate a match only if a value of a first attribute of the third feature vector was located in an area of the expanded attribute of the first feature vector and a value of a second attribute of the third feature vector matched the value of the non-expanded attribute of the first feature vector.

12. A method of operating a memory, the method comprising:
    generating a first feature vector that includes an attribute, wherein at least a portion of the value of the attribute of the first feature vector includes do not care data;
    generating a second feature vector that includes an attribute;
    programming a first string of memory cells of the memory to store the first feature vector wherein each memory cell of the first string of memory cells has a control gate coupled to a different access line and wherein the first string of memory cells is selectively connected to a particular data line;
    programming a second string of memory cells of the memory to store the second feature vector wherein each memory cell of the second string of memory cells has a control gate coupled to a different access line and wherein the second string of memory cells is selectively connected to the particular data line; and
    logically summing outputs of the first string of memory cells and the second string of memory cells;
    wherein programming a digit of the attribute of the first feature vector as do not care data comprises programming each memory cell of a pair of memory cells of the first string of memory cells to a threshold voltage greater than a particular voltage;
    wherein reading the digit of the attribute of the first feature vector comprises applying voltages across control gates of each memory cell of the pair of memory cells such that at least one of the voltages applied across the control gates is less than or equal to the particular voltage.

13. The method of claim 12 wherein programming the string of memory cells of the memory to store the digit of the attribute of the first feature vector comprises programming a string of memory cells connected in series between a data line and a source.

14. The method of claim 12 wherein generating the second feature vector that includes its attribute comprises generating the second feature vector such that at least a portion of the value of the attribute of the second feature vector includes do not care data.

15. A comparison unit including a string of memory cells:
wherein the comparison unit is configured to program the string of memory cells to store do not care data as at least a portion of a value of an attribute of a first feature vector and as at least a portion of a value of an attribute of a second feature vector;
wherein the comparison unit is further configured to permit comparing a value of an attribute of a received feature vector to a value of the attribute of the first feature vector and to a value of the attribute of the second feature vector both individually and concurrently;
wherein the comparison unit is further configured to store a digit of the attribute of a particular feature vector selected from a group consisting of the first feature vector and the second feature vector in a pair of memory cells of the string of memory cells that each have a control gate coupled to a different access line; and
wherein the comparison unit is further configured to read the digit of the attribute of the particular feature vector by applying a first voltage level to the access line coupled to the control gate of one memory cell of the pair of memory cells and by applying a second voltage level, different from the first voltage level, to the access line coupled to the control gate of the other memory cell of the pair of memory cells.

16. The comparison unit of claim 15, wherein the comparison unit being configured to store the digit of the attribute of the particular feature vector in the pair of memory cells of the string of memory cells comprises the comparison unit being configured to program the pair of memory cells of the string of memory cells to store the do not care data for the digit of the attribute of the particular feature vector.

17. The comparison unit of claim 15, wherein the comparison unit being configured to program the pair of memory cells of the string to store the do not care data for the digit of the attribute of the particular feature vector comprises the comparison unit being configured to program each of the memory cells of the pair of memory cells to a threshold voltage between the first voltage level and the second voltage level.

18. A system comprising:
a processor configured to generate a first feature vector including do not care data as at least a portion of a value of an attribute of the first feature vector and configured to generate a second feature vector including do not care data as at least a portion of a value of an attribute of the second feature vector; and
a comparison unit coupled to the processor and configured to program a string of memory cells to store at least a portion of the first feature vector and at least a portion of the second feature vector;
wherein the comparison unit is configured to program a digit of the attribute of a particular feature vector selected from a group consisting of the first feature vector and the second feature vector as do not care data by programming each memory cell of a pair of memory cells of the string of memory cells to a threshold voltage greater than a particular voltage; and
wherein the comparison unit is configured to read the digit of the attribute of the particular feature vector by applying the particular voltage across a control gate of one memory cell of the pair of memory cells and applying a different voltage, greater than the particular voltage, across a control gate of the other memory cell of the pair of memory cells.

19. The system of claim 18 wherein the comparison unit comprises memory comprising a plurality of strings of memory cells.

20. The system of claim 18 wherein the comparison unit comprises a plurality of comparison units.

21. The system of claim 18 wherein the processor comprises a pre-processor and further comprising a post-processor, wherein the post-processor is configured to control comparison of a received feature vector to the stored feature vectors.

22. The system of claim 21 wherein the post-processor comprises a memory controller.

23. The system of claim 19 wherein the comparison unit comprises a page buffer coupled to the plurality of strings of memory cells and configured to perform at least one of: comparisons between input feature vectors and data feature vectors, logically combine feature vectors, and/or logically sum feature vectors.

* * * * *